(12) United States Patent
Arceo de la Pena et al.

(10) Patent No.: US 10,950,440 B2
(45) Date of Patent: Mar. 16, 2021

(54) PATTERNING DIRECTLY ON AN AMORPHOUS SILICON HARDMASK

(71) Applicant: INTERNATIONAL BUSINESS MACHINES CORPORATION, Armonk, NY (US)

(72) Inventors: Abraham Arceo de la Pena, Albany, NY (US); Ekmini Anuja De Silva, Slingerlands, NY (US); Nelson Felix, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/691,645

(22) Filed: Nov. 22, 2019

(65) Prior Publication Data

US 2020/0090928 A1 Mar. 19, 2020

Related U.S. Application Data

(62) Division of application No. 15/817,407, filed on Nov. 20, 2017, now Pat. No. 10,755,926.

(51) Int. Cl.
*H01L 21/027* (2006.01)
*H01L 21/033* (2006.01)
(Continued)

(52) U.S. Cl.
CPC ...... *H01L 21/0273* (2013.01); *H01L 21/0234* (2013.01); *H01L 21/02356* (2013.01);
(Continued)

(58) Field of Classification Search
CPC ............... H01L 27/1211; H01L 21/845; H01L 21/31144; H01L 21/32155;
(Continued)

(56) References Cited

U.S. PATENT DOCUMENTS 5,855,804 A * 1/1999 Walker .................. B24B 37/013
216/89
5,960,268 A * 9/1999 Aihara .............. H01L 29/66772
438/166
(Continued)

FOREIGN PATENT DOCUMENTS

CN 104851785 A 8/2015
CN 111316398 A 6/2020
(Continued)

OTHER PUBLICATIONS

IBM, List of IBM Patents or Patent Applications Treated as Related, Appendix P, dated Dec. 27, 2019, 2 pages.
(Continued)

*Primary Examiner* — Changhyun Yi
(74) *Attorney, Agent, or Firm* — Erik K. Johnson

(57) ABSTRACT

The invention herein includes enhancing the surface of an amorphous silicon hardmask through implantation of non-polar, hydrophobic elements, resulting in increased hydrophobicity and increased resist adhesion of the amorphous silicon surface. According to the invention, implanting the hydrophobic elements may involve introduction of the hydrophobic elements into the surface of the amorphous silicon by way of low energy implantation and plasma treatment. The implanted hydrophobic element may be Boron, Xenon, Fluorine, Phosphorus, a combination thereof, or other hydrophobic elements. According to the invention, the surface of the amorphous silicon is enhanced with 10-15% hydrophobic element, however in other embodiments, this composition may be adjusted as needed. In any case, however, the invention herein includes maintaining an etch selectivity of the bulk amorphous silicon hardmask.

15 Claims, 2 Drawing Sheets

(51) Int. Cl.
*H01L 21/3215* (2006.01)
*H01L 21/02* (2006.01)
*H01L 21/3205* (2006.01)
*H01L 21/768* (2006.01)

(52) U.S. Cl.
CPC .... *H01L 21/02592* (2013.01); *H01L 21/0332* (2013.01); *H01L 21/32055* (2013.01); *H01L 21/32155* (2013.01); *H01L 21/76826* (2013.01)

(58) Field of Classification Search
CPC ......... H01L 21/32055; H01L 21/02356; H01L 21/0338; H01L 21/0274; G03F 7/0751
See application file for complete search history.

(56) References Cited

U.S. PATENT DOCUMENTS

| | | | |
|---|---|---|---|
| 6,066,578 A | 5/2000 | Gupta | |
| 6,165,695 A | 12/2000 | Yang | |
| 6,533,907 B2 | 3/2003 | Demaray | |
| 6,762,133 B1 | 7/2004 | Rangarajan | |
| 6,806,203 B2 | 10/2004 | Weidman | |
| 6,930,015 B2 | 8/2005 | Ping | |
| 7,132,369 B2 | 11/2006 | Delgadino | |
| 7,642,195 B2 | 1/2010 | Yeh | |
| 7,803,715 B1 | 9/2010 | Haimson | |
| 2005/0073011 A1* | 4/2005 | Taguwa | H01L 21/324 257/371 |
| 2007/0154851 A1 | 7/2007 | Ahn | |
| 2008/0315296 A1 | 12/2008 | Tanaka | |
| 2009/0104541 A1 | 4/2009 | Kim | |
| 2014/0024215 A1* | 1/2014 | Cheng | H01L 21/3081 438/689 |
| 2014/0094038 A1 | 4/2014 | Haverkamp | |
| 2015/0235864 A1 | 8/2015 | Vogt | |
| 2016/0379887 A1 | 12/2016 | Basker | |
| 2017/0025306 A1* | 1/2017 | Wang | H01L 21/02592 |
| 2017/0256568 A1 | 9/2017 | Shen | |
| 2018/0076042 A1* | 3/2018 | Cheng | H01L 21/28525 |
| 2018/0247813 A1 | 8/2018 | St Amour | |
| 2019/0157072 A1 | 5/2019 | Arceo De La Pena | |

FOREIGN PATENT DOCUMENTS

| | | |
|---|---|---|
| DE | 102015102225 A1 | 8/2015 |
| DE | 112018004654 T5 | 6/2020 |
| GB | 2580279 A | 7/2020 |
| WO | 2019097444 A1 | 5/2019 |

OTHER PUBLICATIONS

International Searching Authority, "Notification of Transmittal of the International Search report and the Written Opinion of the International Searching Authority, or the Declaration", Patent Coorporation Treaty, Mar. 13, 2019, 9 pages, International Application No. PCT/!82018/058996.

* cited by examiner

PATTERNING DIRECTLY ON AN AMORPHOUS SILICON HARDMASK

BACKGROUND

The present invention relates generally to semiconductor device fabrication, and more particularly to patterning directly on an amorphous silicon hardmask.

In semiconductor device manufacturing, patterning directly on an amorphous silicon (a-Si) hardmask is difficult to achieve with high resolution due to poor adhesion between the a-Si hardmask and a subsequent resist layer. In typical practice, this adhesion at high resolutions requires deposition of an intermediary layer to facilitate adhesion, known as an organic layer. However, incorporating additional planar layers such as the organic layer not only results in additional resource expenditures, such as cost and time, but also increases integrated circuit complexity as the organic layer need be later removed.

SUMMARY

According to one exemplary embodiment of the present invention, a method is provided. The method includes enhancing the surface of an amorphous silicon hardmask through implantation of nonpolar, hydrophobic elements, that results in increased hydrophobicity and increased resist adhesion of the amorphous silicon surface. According to the method, implanting the hydrophobic elements involves introduction of the hydrophobic elements into the surface of the amorphous silicon by way of low energy implantation and plasma treatment. Moreover, in this method, the implanted hydrophobic element is boron, however in other embodiments, the hydrophobic elements include xenon, fluorine, phosphorus, and other hydrophobic elements. According to the method, the surface of the amorphous silicon is enhanced with 10-15% hydrophobic element, however in other embodiments, this composition may be adjusted as needed. In any case, however, the method herein maintains an etch selectivity of the bulk amorphous silicon hardmask.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
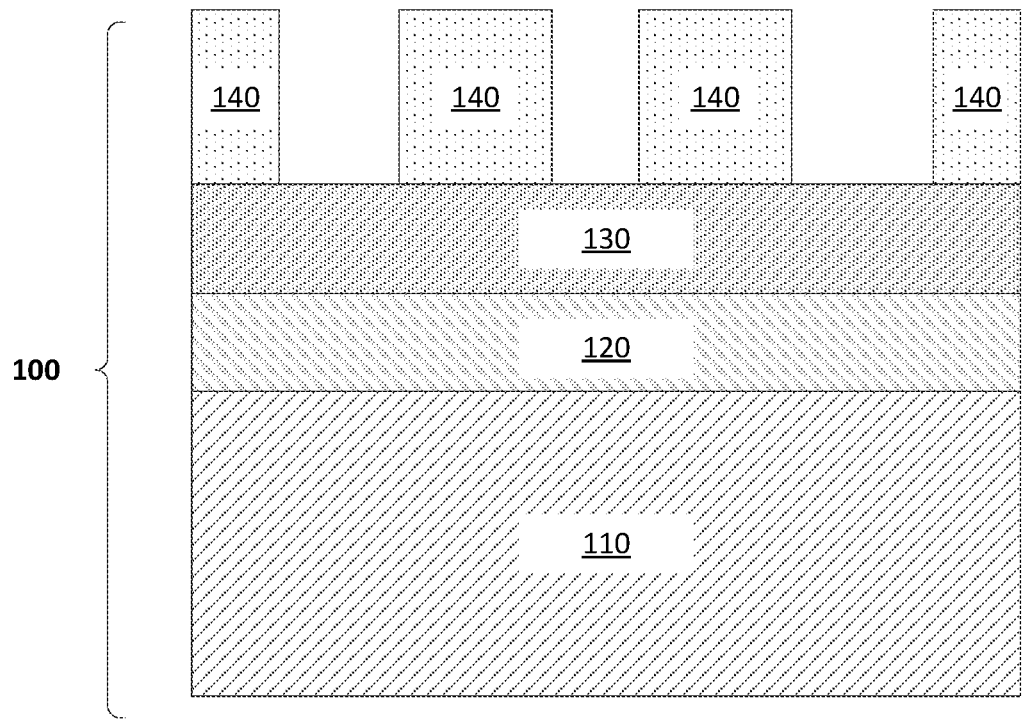
FIG. 1 depicts a cross-sectional view of a typical quad-layer patterning stack 100, in accordance with an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Semiconductor device manufacturing generally includes various steps, including a patterning process. For example, the manufacturing of a semiconductor chip may start with CAD (computer aided design) generated device patterns and may continue with the effort to replicate these device patterns in a substrate in which semiconductor devices can be formed. The replication process may involve the use of a photolithography process in which a layer of photo-resist material may be first applied on top of a substrate, and then be selectively exposed according to a pre-determined device pattern. Portions of the photo-resist that are exposed to light or other ionizing radiation (e.g., ultraviolet, electron beams, X-rays, etc.) may experience some changes in their solubility to a certain solution. Next, the photo-resist may be developed in a developer solution, thereby removing the non-irradiated (in a negative resist) or irradiated (in a positive resist) portions of the resist layer, to create a photo-resist pattern. The photo-resist pattern may subsequently be copied or transferred to the substrate underneath the photo-resist pattern.

Applying photoresist, and patterning in general, directly on an amorphous silicon (a-Si) hardmask at high resolutions is difficult due to poor adhesion between the a-Si hardmask and subsequent resist layer. In typical practice, adhesion at high resolutions requires deposition of an intermediary layer to facilitate adhesion, known as an organic layer. However, incorporating additional planar layers such as the organic layer not only results in additional resource expenditures, such as cost and time, but results also in additional complexity as the organic layer need be later removed. The present invention proposes patterning at high resolutions directly only an a-Si hardmask by eliminating the organic layer and increasing a hydrophobicity of the a-Si hardmask via low energy implantation and/or plasma treatment. Not only does this process eliminate the time and cost consumed by forming and removing the organic layer, but also increases selectivity and provides greater options for thinning the subsequent resist layer.

According to one embodiment of the present invention, a method for patterning a resist layer on an amorphous silicon hardmask in semiconductor devices is disclosed. The method comprises forming an amorphous silicon hardmask layer on an underlying stack and implanting a surface of the amorphous silicon hardmask layer with one or more hydrophobic elements. In one embodiment, the method further comprises forming a resist layer directly on the surface of the amorphous silicon hardmask layer. In various embodiments of the method, implanting the surface of the amorphous silicon hardmask layer with the one or more hydrophobic elements is performed via plasma treatment and low energy treatment. Moreover, the implantation modifies a composition of the surface of the amorphous silicon hardmask layer to comprise 10-15% of the one or more hydrophobic elements, yet the amorphous silicon hardmask layer maintains a same bulk etch selectivity before and after the implantation. In an embodiment of the method described herein, the hydrophobic elements include boron, however in other embodiments of the method include xenon, fluorine, and phosphorus. The resist layer is a photoresist and, according to one embodiment, a native oxide layer of the surface of the amorphous silicon hardmask layer is removed through dilute hydrofluoric acid type wet cleaning while, according to another embodiment, the native oxide layer is retained.

In accordance with another embodiment of the present invention, a method for increasing amorphous silicon hardmask resist adhesion is provided. Embodiments of the method include implanting a surface of an amorphous silicon hardmask layer with one or more hydrophobic elements. According to various embodiments, implanting the surface of the amorphous silicon hardmask layer with the one or more hydrophobic elements is performed via low energy implantation and plasma treatment. Moreover, the one or more hydrophobic elements include at least one element selected from a group comprising boron, xenon, fluorine, and phosphorus.

In a yet further embodiment of the present invention, a structure is disclosed. The structure comprises an amorphous silicon hardmask layer having an upper surface composition that includes one or more hydrophobic elements and a resist layer on the upper surface of the amorphous silicon hardmask layer. The structure further defines the upper surface composition of the amorphous silicon hardmask layer as having 10-15% of the one or more hydrophobic elements. Moreover, the one or more hydrophobic elements include at least one of boron, xenon, fluorine, and phosphorus. In this embodiment, the amorphous silicon hardmask layer maintains an etch selectivity consistent with amorphous silicon despite the modified composition of the surface.

FIG. 1 depicts a cross-sectional view of a typical quad-layer patterning stack 100, in accordance with an embodiment of the present invention. In the example embodiment, the typical quad-layer patterning stack includes underlying stack 110, a-Si hardmask 120, organic layer 130, and resist layer 140, all of which can be formed on top of one another and in sequence. Quad-layer patterning stack 100 illustrates the typical practice of adhering resist layer 140 to a-Si hardmask 120 through the use of organic layer 130.

In the example embodiment, underlying stack 110 is a dielectric material suitable for back end of line (BEOL) or middle of line (MOL) interconnect structures. In other embodiments, underlying stack 110 is a gate materials suitable for front end of line (FEOL) structures. Alternatively, underlying stack 110 is a semiconductor material or a dielectric material on top of a semiconductor material. In yet further embodiments, underlying stack 110 is an organic planarization layer (OPL), or layer of material that is planarized by known chemical mechanical polishing techniques. For example, underlying stack 110 is an amorphous carbon layer able to withstand the high process temperatures of subsequent processing steps. In general, underlying stack 110 may be any suitable substrate for deposition of a-Si, such as other hardmasks, oxide, tetraethyl orthosilicate (TEOS), titanium nitride (TiN), Silicon Nitride (SiN), other metals, plastics, glasses, and the like.

Figure 2:
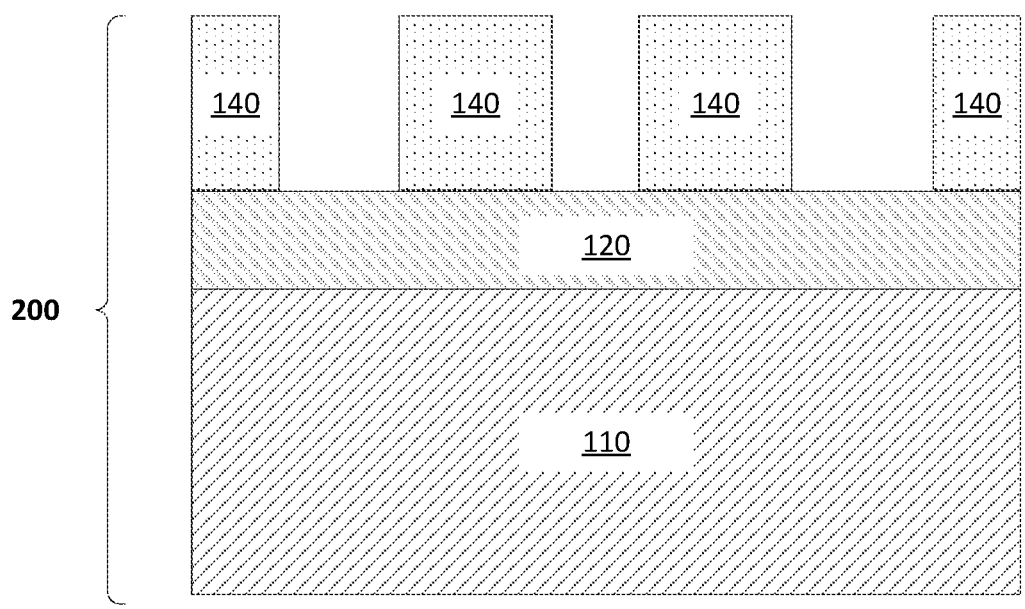
FIG. 2 depicts a cross-sectional view of a tri-layer patterning stack 200, in accordance with an embodiment of the present invention.

In the example embodiment, a-Si hardmask 120 is an amorphous silicon. Amorphous silicon (a-Si) is a non-crystalline form of silicon that, as used herein, provides a hardmask that delineates etching patterns and shields portions of the quad-stack during the etching process. A-Si is preferred for use as a hardmask due to its high selectivity to resist, with or without a native oxide layer, but avoided due to its poor resist adhesion at high resolutions. To that point, patterning resist layer 140 directly on a-Si hardmask 120 has a resolution limit of 50 nm pitch due to pattern collapse, as depicted by FIG. 2. Accordingly, in typical practice, organic layer 130 is applied as an intermediary between a-Si hardmask 120 and resist layer 140 in order to increase resist adhesion and thereby facilitate higher resolution patterning. While the use of organic layer 130 increases resist adhesion and resolution limits, the use of organic layer 130 increases cost and complexity of quad-layer patterning stack 100 as organic layer 130 must not only be formed, but also removed.

In the example embodiment, organic layer 130 is a planar layer applied to facilitate adhesion between a-Si hardmask 120 and resist layer 140. Organic layer 130 can include metallic content, such as silicon (Si), and organic content.

Resist layer 140 is formed directly on top of organic layer 130 and includes a suitable resist material. In semiconductor fabrication, resist layer 140 is a thin layer used to transfer a circuit pattern to the semiconductor substrate which it is deposited upon. A resist can be patterned via lithography to form a temporary mask that protects selected areas of the underlying substrate during subsequent processing steps.

For example, resist layer 140 is a particular photo-resist material chosen for the desired pattern to be formed and the exposure method used. In such embodiments, resist layer 140 includes a single exposure resist suitable for, for example, argon fluoride (ArF); a double exposure resist suitable for, for example, a thermal cure system; or an extreme ultraviolet (EUV) resist suitable for, for example, an optical process.

FIG. 2 depicts a cross-sectional view of tri-layer patterning stack 200, in accordance with the example embodiment of the present invention. Unlike quad-layer patterning stack 100 in which organic layer 130 is incorporated to increase resist adhesion and patterning resolution between a-Si hardmask 120 and resist layer 140, tri-layer patterning stack 200 lacks organic layer 130 and resist layer 140 is applied directly onto a-Si hardmask 120.

As previously mentioned, patterning directly on a-Si hardmask 120 is desirable for resist selectivity and providing options for thinning resist layer 140, however is difficult to perform at high resolutions due to poor adhesion between a-Si hardmask 120 and resist layer 140. As illustrated by FIG. 3, patterning resist layer 140 directly on a-Si hardmask 120 at resolutions greater than 50 nm result in pattern collapse, or line flop over. Thus, a solution is needed that combines the benefits of both having organic layer 130 for enhanced patterning resolution as well as the omission of organic layer 130 for greater resist selectivity and thinning of resist layer 140. The present invention described herein achieves this result by, in lieu of applying organic layer 130 to a-Si hardmask 120, increasing the resist adhesion of a-Si hardmask 120, thereby increasing patterning resolution.

According to the example embodiment, enhancing the resist adhesion of a-Si hardmask 120 involves increasing the hydrophobicity of a surface of a-Si hardmask 120 through low energy implantation and/or plasma treatment. More specifically, enhancing a-Si hardmask 120 is performed by implanting a-Si hardmask 120 with nonpolar, hydrophobic elements such as boron, fluorine, phosphorus, xenon, and other suitable elements that increase hydrophobicity. Importantly, in order to avoid modification of the bulk film composition of a-Si hardmask 120, i.e. only affect the surface, the enhancement is performed such that resist adhesion of a-Si hardmask 120 is enhanced while still maintaining the bulk film composition of a-Si hardmask 120. Thus, etch sensitivity of a-Si hardmask 120 is not compromised.

In the example embodiment, the amounts and compositions of the implanted hydrophobic elements may vary based on performance and cost parameters as needed. However, for the purposes of illustration, a test case is described herein. In the test case, boron was implanted in various amounts to alter the surface composition of a-Si hardmask 120 as illustrated by Table 1, below:

TABLE 1

Boron Implanted a-Si Hardmask

| Surface Treatment Condition | Surface Composition of Added Element (%) | Contact Angle (°) |
| --- | --- | --- |
| B implantation | 0 | 30 |
| B implantation | 4 | 30 |
| B implantation | 8 | 39 |
| B implantation | 10 | 45 |
| B implantation | 15 | 53 |

With reference to Table 1 and the aforementioned test case, the surface of a-Si hardmask 120 was modified by implanting anywhere from 0-15% boron at contact angles varying from 30-53° using low energy level implantation. In this particular test, a-Si hardmask 120 having a 10% boron surface composition was tested using extreme ultraviolet patterning at a resolution of 36 nm pitch. As illustrated by FIG. 4, a-Si hardmask 120 having a 10% boron implantation was capable of having resist patterned without any pattern collapse at 36 nm, as opposed to a resolution limit of 50 nm exhibited by untreated a-Si hardmask 120 (depicted in FIGS. 3A-C). Moreover, etch selectivity in the test case did not change using CHF3/CF4 chemistry, nor did the implantation have an effect on the bulk etch selectivity, as 1:7 selectivity was maintained. Thus, as illustrated by the test case above and claimed herein, resist adhesion and patterning resolution of a-Si hardmask 120 can be improved through implantation of hydrophobic elements, thereby providing benefits such as eliminating the need for organic layer 130, increasing resist selectivity, and reducing stack size, stack fabrication complexities, and costs.

Figure 3A:
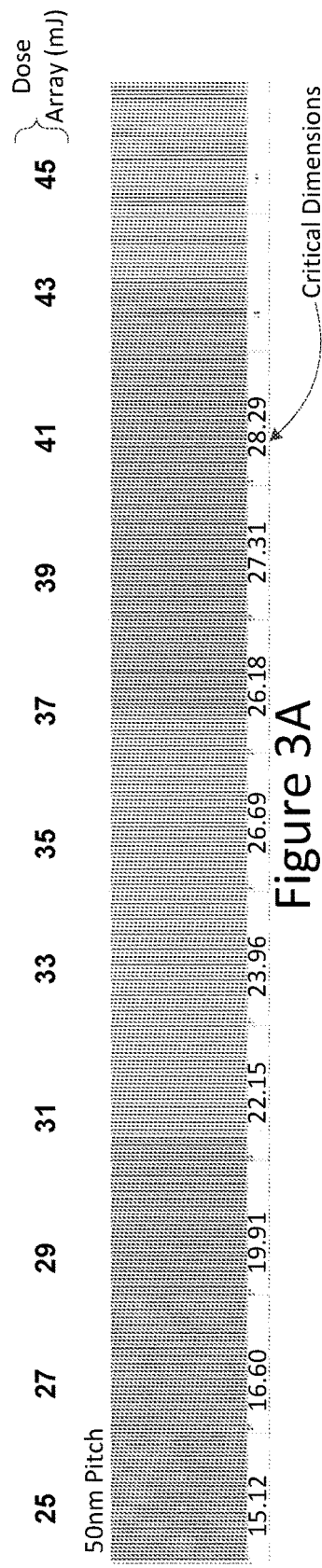
FIGS. 3A-C depict pattern collapse due to poor resist adhesion when patterning directly on an amorphous silicon hardmask, in accordance with an embodiment of the present invention.
Figure 3B:
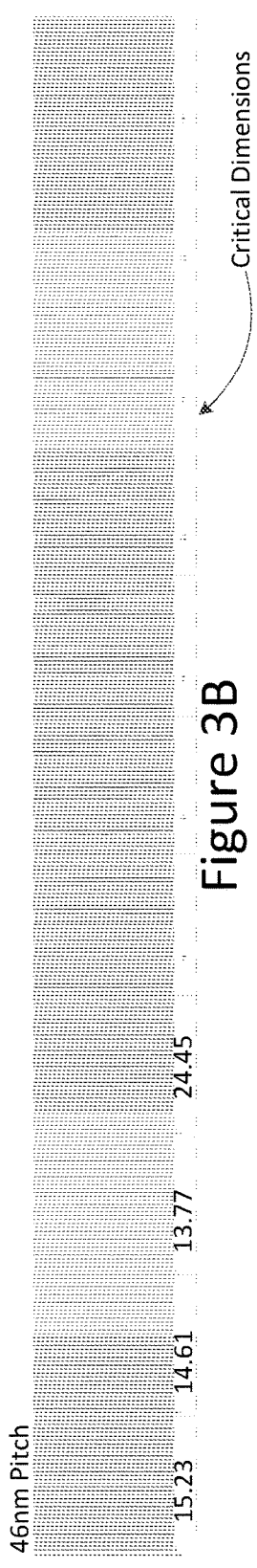
Figure 3C:
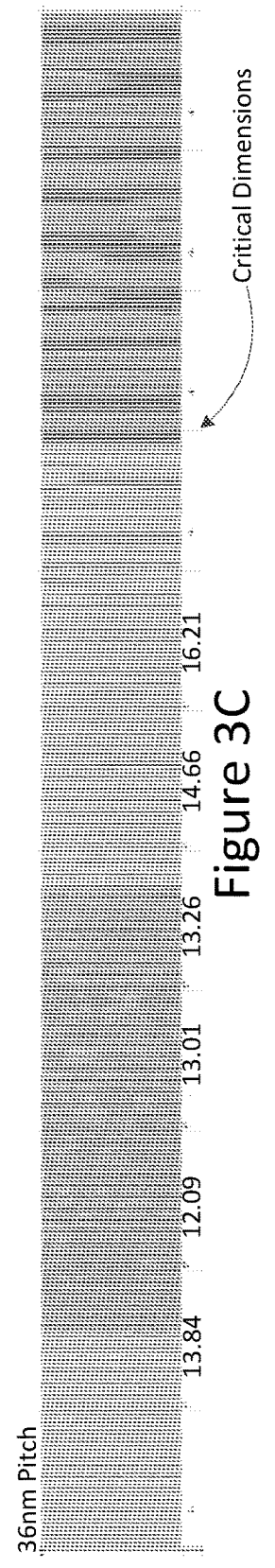
Figure 4:
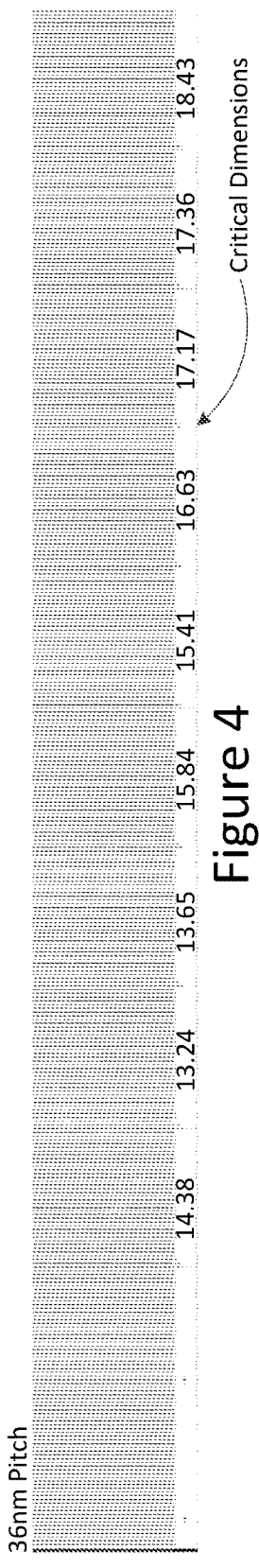
FIG. 4 depicts an absence of pattern collapse when patterning directly on amorphous silicon hardmask having a 10% boron implantation, in accordance with an embodiment of the present invention.

FIGS. 3A-C depict instances of pattern collapse at a fixed −0.06 um focus when patterning resist layer 140 directly on to a-Si hardmask 120 at dose arrays varying from 25-45 mJ (note that the dose array is applicable to all of FIGS. 3A-C and FIG. 4). FIG. 3A depicts the results of patterning resist layer 140 directly on a-Si hardmask 120 at 50 nm pitch, FIG. 3B at 46 nm pitch, and FIG. 3C at 36 nm pitch. Also depicted by FIGS. 3A-C are the critical dimensions identified for each dosage and pitch, with a dot denoting that the critical dimensions were not ascertainable due to total pattern collapse or inability for the machine to recognize a pattern. As illustrated by FIGS. 3B-C, patterning begins to collapse at pitches having a resolution greater than 50 nm due to poor resist adhesion and, thus, a-Si hardmask 120 typically has a resolution limit of 50 nm pitch when receiving direct resist patterning. Because it is often desirable to have a resolution greater than 50 nm, typical practice introduces organic layer 130 to facilitate in adhering resist layer 140 to a-Si hardmask 120, as illustrated by FIG. 1. Use of organic layer 130 allows for subsequently patterning resist layer 140 at resolutions greater than 50 nm, however does so at the cost of adding an extra planar layer that must later be removed from the stack, thereby increasing circuit complexity and costs.

FIG. 4 illustrates an absence of pattern collapse when patterning directly on amorphous silicon having a 10% boron implantation, in accordance with an embodiment of the present invention. Like FIGS. 3A-C, FIG. 4 depicts an image taken at a fixed −0.06 um focus after patterning resist layer 140 directly on to a-Si hardmask 120 at dose arrays varying from 25-45 mJ. Here, however, the surface of a-Si hardmask 120 is implanted with 10% boron, as described herein, and, in contrast to the pattern collapse depicted in FIGS. 3A-C at pitches less than 50 nm, boron implanted a-Si hardmask 120 shows no signs of pattern collapse at 36 nm. That is, resist layer 140 is applied to a-Si hardmask 120 identically in both FIGS. 3C and 4, yet patterning on the a-Si hardmask 120 having a 10% boron implantation results in little to no pattern collapse at resolutions less than 50 nm, as depicted by FIG. 4.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed:

1. A method for patterning a resist layer on an amorphous silicon hardmask in semiconductor devices, the method comprising:
    forming an amorphous silicon hardmask layer on an underlying stack;
    implanting a surface of the amorphous silicon hardmask layer with one or more hydrophobic elements to form an upper surface of the amorphous silicon hardmask, wherein the upper surface is defined by an implantation thickness achieved via a low energy implantation, wherein the upper surface and a bulk material of the amorphous silicon hardmask have different chemical compositions; and
    forming a photoresist layer directly on the upper surface of the amorphous silicon hardmask layer, wherein the photoresist layer comprises a plurality of structures, and wherein the plurality of structures have having a pitch less than 50 nm between each of the plurality of the structures.

2. The method of claim 1, wherein implanting the surface of the amorphous silicon hardmask layer with the one or more hydrophobic elements is performed via plasma treatment.

3. The method of claim 1, wherein implanting the surface of the amorphous silicon hardmask layer with one or more hydrophobic elements modifies a composition of the surface of the amorphous silicon hardmask layer to comprise 10-15% of the one or more hydrophobic elements.

4. The method of claim 1, wherein the amorphous silicon hardmask layer maintains a same bulk etch selectivity before and after implanting the surface of the amorphous silicon hardmask layer with the one or more hydrophobic elements.

5. The method of claim 1, wherein the one or more hydrophobic elements includes boron.

6. The method of claim 1, wherein the one or more hydrophobic elements include xenon.

7. The method of claim 1, wherein the one or more hydrophobic elements include fluorine.

8. The method of claim 1, wherein the one or more hydrophobic elements include phosphorus.

9. The method of claim 1, wherein the resist layer is a photoresist.

10. The method of claim 1, wherein a native oxide layer of the surface of the amorphous silicon hardmask layer is removed through dilute hydrofluoric acid type wet cleaning.

11. The method of claim 1, wherein a native oxide layer of the surface of the amorphous silicon hardmask layer is retained.

12. A method for increasing amorphous silicon hardmask resist adhesion, the method comprising:
    implanting a surface of an amorphous silicon hardmask layer with one or more hydrophobic elements to form an upper surface of the amorphous silicon hardmask, wherein the upper surface and a bulk material of the amorphous silicon hardmask have different chemical compositions; and
    forming a photoresist layer directly on the upper surface of the amorphous silicon hardmask layer.

13. The method of claim 12, wherein implanting the surface of the amorphous silicon hardmask layer with the one or more hydrophobic elements is performed via low energy implantation.

14. The method of claim 12, wherein implanting the surface of the amorphous silicon hardmask layer with the one or more hydrophobic elements is performed via plasma treatment.

15. The method of claim 12, wherein the one or more hydrophobic elements include at least one element selected from a group comprising boron, xenon, fluorine, and phosphorus.

* * * * *